United States Patent [19]
van Kempen

[11] Patent Number: 5,202,289
[45] Date of Patent: Apr. 13, 1993

[54] METHOD OF PLASTICALLY DEFORMING A SEMICONDUCTOR DEVICE LEAD FRAME IN PREPARATION FOR ULTRASONIC BONDING

[75] Inventor: Johannes M. A. M. van Kempen, Nijmegen, Netherlands

[73] Assignee: U.S. Philips Corporation, New York, N.Y.

[21] Appl. No.: 706,823

[22] Filed: May 29, 1991

[30] Foreign Application Priority Data

Jun. 29, 1990 [NL] Netherlands ............. 9001491

[51] Int. Cl.⁵ ............. H01L 21/58; H01L 21/60; H01L 21/603; H01L 21/607
[52] U.S. Cl. ............. 437/220; 437/249
[58] Field of Search ............. 437/209, 220, 249; 228/111; 29/874

[56] References Cited

FOREIGN PATENT DOCUMENTS 61-12052 1/1986 Japan .
1321663 6/1988 Japan .
1-192155 2/1989 Japan .

Primary Examiner—Olik Chaudhuri
Assistant Examiner—David E. Graybill
Attorney, Agent, or Firm—Paul R. Miller

[57] ABSTRACT

A method of manufacturing a semiconductor device comprising a lead frame (2A-2I) and a semiconductor crystal (3) provided on one of the conductors (2C) and comprising at least one semiconductor switching element, and electrically conducting connections (4A-4I) from the crystal (3) to the conductors (2). The conductors (2) are stamped from a metal strip, after which the tag tips (2a) are coined between a coining die (8) and an anvil (6) to remove irregularities. After that, the conducting connections (4A-4I) are secured to the tag tips (2a) by ultrasonic welding. According to the invention, the anvil surface (5A) and the die surface (7) parallel thereto enclose a downward angle ($\alpha$) with the adjoining portion (5B) of the anvil surface, which angle is preferably at least 0.50 and at most 5°.

The invention also relates to a device for carrying out the method, comprising an anvil (6) and a coining die (8), the anvil surface (5) comprising two adjoining flat portions (5A, 5B) which form an obtuse angle ($\beta$) of preferably at least 175° and at most 179.5° enclosing the anvil material (6), the die surface (7) of the coining die (8) being practically parallel to one of the these portions (5A).

2 Claims, 2 Drawing Sheets

METHOD OF PLASTICALLY DEFORMING A SEMICONDUCTOR DEVICE LEAD FRAME IN PREPARATION FOR ULTRASONIC BONDING

The invention relates to a method of manufacturing a semiconductor device having conductors formed from metal strips, a semiconductor crystal provided on one of the conductors and comprising at least one semiconductor switching element, and electrically conducting connections from the crystal to the conductors, by which method the conductors are stamped from a metal strip and the ends of the conductors are subsequently coined between mutually parallel surfaces of an anvil and a coining die moving in a direction transverse to the anvil surface to remove irregularities, after which the conducting connections are secured to the conductor ends by ultrasonic welding.

BACKGROUND OF THE INVENTION

Such a method is known from, for example, the Japanese Patent Application (Kokai) JP-A-1192155 laid open for public inspection and published in Pat. Abstr. of Japan, vol. 13, no. 483 (E-839) p. 161. in the manufacture of lead frames from a metal strip, the desired conductor pattern is obtained through stamping by means of a cutting tool which moves along the edge of an anvil. An undesirable side effect is that plastic deformation of the material, depending on the thickness and hardness of the material, causes rounded edges at the top where the cutting tool enters the metal, and projecting rims or burrs at the bottom, while the surface between the edges is not flat, but shows oblique facets.

To avoid these adverse side effects; those portions of the lead frame on which certain operations are to be carried out later, in particular the ends of the conductor tags on which the connection conductors to the crystal are to be applied by ultrasonic welding (or bonding), are freed from the irregularities described above by a cold-stamping or coining operation. This results in a flat and polished surface.

However, this involves the problem that the tension and compression forces occurring in the material during coining lead to deformation of both the upper and the lower side of the conductor ends. The result of this is that the conductor end thus processed no longer lies in the same plane as the remaining portion of the conductor tag after the operation, but encloses an angle with it. This angle is such that the coined conductor tip does not touch the heating block, but projects slightly upwards when, as is usual, the conductor tags are clamped with the non-coined portion against the heating block of the ultrasonic bonding device for the purpose of bonding. This means that not only does the conductor tip fail to come to the required temperature, but also that the exposed conductor tip acts as a damper for the ultrasonic energy. The result of this is that the connection with the crystal is not or is only imperfectly realised.

SUMMARY OF THE INVENTION

The present invention has for its purpose inter alia to provide a method by which the disadvantages described above are avoided or at least substantially reduced.

The invention is based inter alia on the recognition that the envisaged object can be achieved in that the die surface of the coining die and a portion of the anvil surface are bevelled in a suitable direction.

According to the invention, a method of the kind described in the opening paragraph is characterized in that the anvil surface at the area of the conductor tip to be coined as well as the die surface of the coining die parallel to it enclose a downward angle with the adjoining portion of the anvil surface.

The measure according to the invention has the result that the conductor tip lies practically in one plane with the remaining portion of the conductor tag after coining, or encloses an angle with it whose direction is opposed to that of the angle obtained without the implementation of the invention. Consequently, the coined tag tip is in contact with the heating block over its entire length during bonding, when the non-coined portion of the tag is clamped against the heating block. The tag tip thus gets the temperature required for bonding, while no energy losses caused by damping occur anymore.

In practice, a bevelling angle of at least 0.5° and at most 5° are generally found to give the best results.

The invention further relates to a device for carrying out the method according to the invention. The device according to the invention, comprising an anvil and a coining die for coining ends of conductors of a lead frame, is characterzed in that the anvil surface has two adjoining flat portions which form an obtuse angle which encloses the anvil material, while the die surface of the coining die is practically parallel to one of these portions. This angle is preferably at least 175° and at most 179.5°.

BRIEF DESCRIPTION OF THE DRAWINGS

The invention will now be explained in more detail with reference to an embodiment and the drawing, in which.

The Figures are diagrammatical and not drawn to scale. Corresponding parts are indicated with the same reference numerals in the different Figures as a rule.

DESCRIPTION OF THE INVENTION

Figure 1:
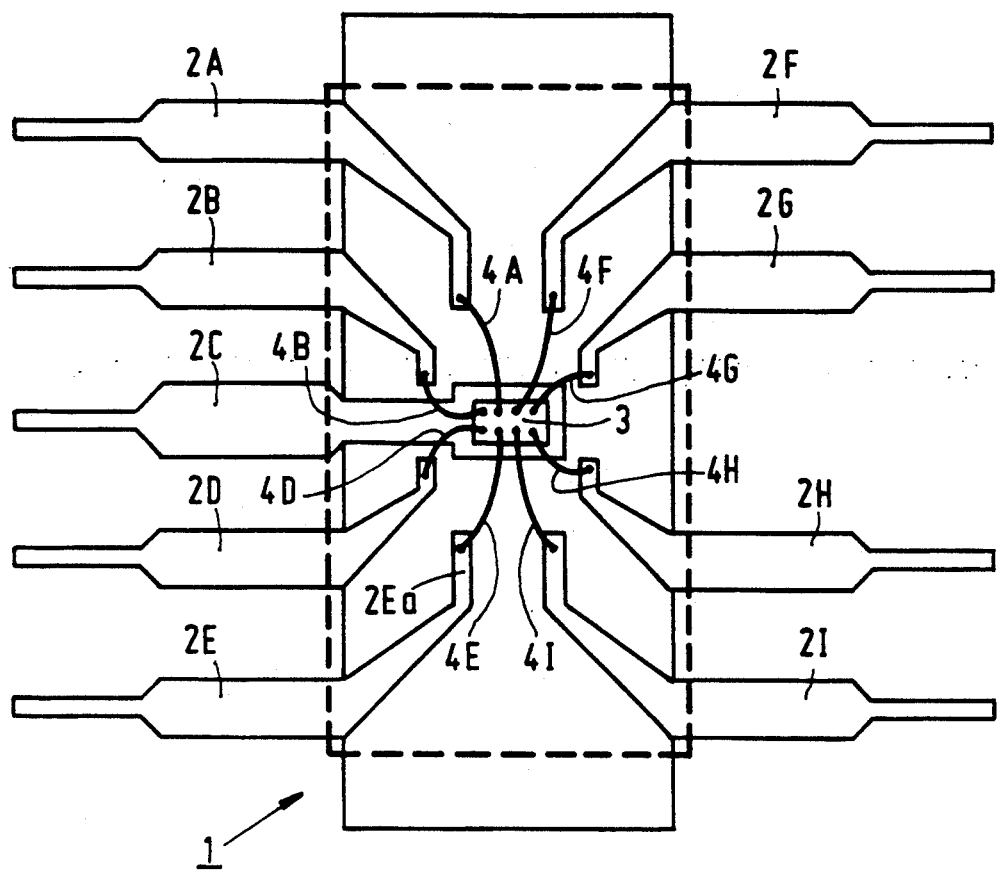
FIG. 1 shows a plan view of a semiconductor device manufactured by the method according to the invention.

FIG. 1 shows a plan view of a semiconductor device 1 manufactured by the application of the invention. This device comprises conductors 2A through 2I formed from metal strips and one semiconductor crystal 3 provided on one of the conductors 2C. Only nine conductors 2 are drawn in the Figure for reasons of clarity, but in practice more conductors will usually be present. The crystal 3 comprises at least one semiconductor switching element, and in practice usually comprises an integrated semiconductor circuit. Electrically conducting connections 4A, 4B, 4D 4I, for example in the form of metal wires, constitute the connections between the crystal 3 and the conductors 2.

The conductor tags 2 are manufactured by stamping from a metal strip, for example made of copper, by means of a cutting tool which moves along an anvil.

Figure 2:
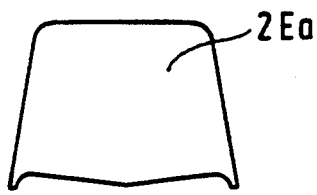
FIG. 2 shows a cross-section of a conductor tag tip after stamping, FIGS. 3A and 3B diagrammatically show two stages of a coining operation of the tag tip according to the present state of the art, FIG. 4 diagrammatically shows a tag tip during the coining operation according to the invention, and FIGS. 5 and 6 diagrammatically show two stages of the ultrasonic welding operation on a tag tip manufactured by the method according to the invention.

During this, as stated above, plastic deformation causes rounded edges at the top and projecting rims or burrs at the bottom, as well as oblique facets. See FIG. 2, in which a cross-section of a stamped-out tag tip 2E*a* is shown.

Figure 3A:
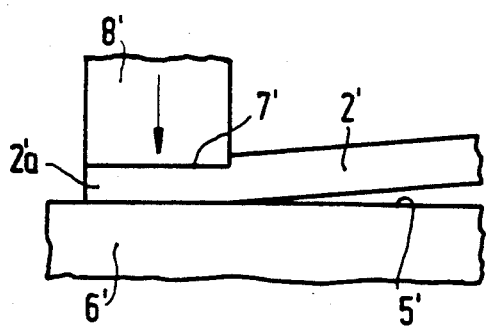
Figure 3B:
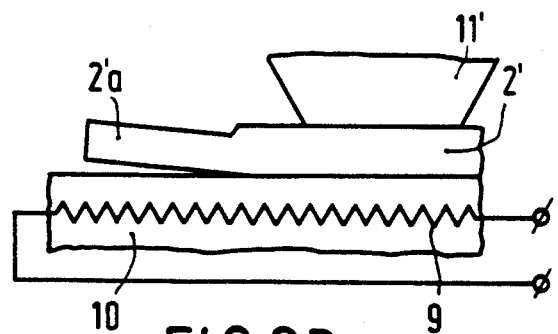

These irregularities must be eliminated if the subsequent bonding of the connection wires 4 to the tag tips is to be carried out effectively. For this purpose, a cold-stamping or coining operation is carried out. FIGS. 3A and 3B show two stages in the method by which this is done according to the present state of the art. The conductors 2' with tips 2'*a* are put on a flat surface 5' of an anvil 6'. The tips 2'*a* are then coined between the mutually parallel surfaces 5' and 7' of the anvil 6' and of the coining die 8', which moves in a direction transverse to the anvil surface 5', see FIG. 3A.

During this, the conductor tips 2'*a* are plastically deformed by the tension and compression forces occurring both at the top and at the bottom. As a result, the conductor 2' and the tip 2'*a* no longer lie in the same plane after coining, but they enclose an angle, as is shown in FIG. 3A.

After coining, the conductors 2' are pressed against the flat surface of the heating block 10 of the bonding device, which block is brought to the desired temperature for bonding by a heater element 9. It is evident in FIG. 3B that the tip 2'*a* then has an upward angle. It will not achieve the required temperature then and in addition acts as a damper to the ultrasonic acoustic energy to be supplied during bonding. Bonding is severly hampered by this, which results in one or several bad connection spots.

A trick sometimes used in practice is to turn the lead frame upside down before coining. This, however, does not eliminate the drawbacks. In addition, the burrs and facets will remain at the upper side in this case, so that the tag tip is not polished over its entire surface during coining. This leads to problems during bonding, while during the manufacture of certain light-sensitive devices such as PRS (Pattern Recognition Systems) it also gives problems with light reflection.

According to the invention, the problems described can be solved by ensuring that the anvil surface 5 at the area of the conductor tip 2*a* to be coined, as well as the die surface 7 of the coining die parallel to it, make a downward angle with the adjoining portion of the anvil surface 5.

Figure 4:
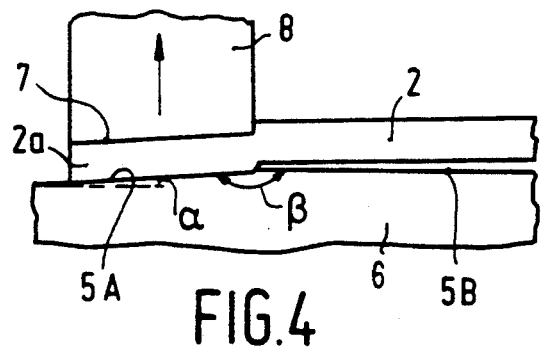

This is shown in FIG. 4, where it can be seen that the anvil surface 5 is divided into two portions 5A and 5B, the portion 5A enclosing a downward angle $\alpha$ with the adjoining portion 5B. The die surface 7 is parallel to the portion 5A, and thus also encloses an angle $\alpha$ with the portion 5B, and an angle $90° - \alpha$ with the direction of movement of the coining die 8.

In this case, a plastic deformation of the material is found to occur under the influence of the exerted tension and compression forces, which results in the conductor tip 2*a* either enclosing an angle with the remaining portion of the conductor tag 2 after coining whose direction is opposed to that of the angle which is obtained without implementation of the invention, or lying substantially in one plane with the non-coined portion 2.

Figure 5:
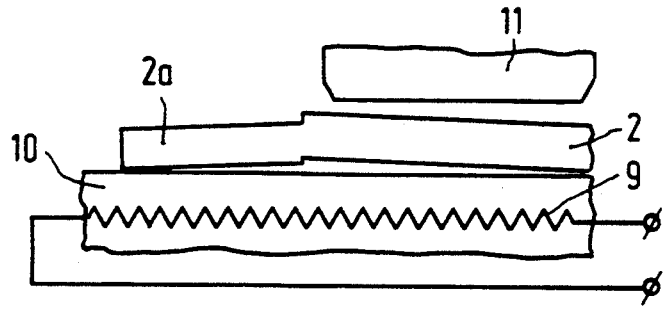
Figure 6:
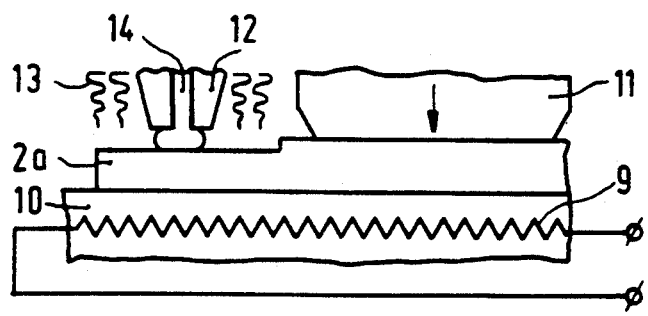

The major difference with the known method is shown in FIGS. 5 and 6. In FIG. 5, the conductor tag (2, 2*a*) rests on the flat surface of the heating block 10 of the bonding device. When the conductor tag 2 is now clamped on the heating block 10 by a clamping member 11 (see FIG. 6), the tip 2*a* is also pressed over its entire length against the block 10, which is heated by the heater element 9, and brought to the correct temperature. Since the tag tip 2*a* makes contact with the block 10 over its entire surface, no damping of the ultrasonic energy 13 (see FIG. 6) supplied through the bonding device 12 occurs, so that the wire 14 can form a good connection with the tag tip 2*a*.

An important advantage of the invention here is that the (initial) resilient pressing automatically eliminates the disadvantage of any irregularities in the clamping plate 11 and in the thickness and the material of the conductor tags (2, 2*a*).

The desired value of the angle $\alpha$ depends on, among other factors, the width and height of the conductor tips and the hardness of the material. It has been shown that an angle $\alpha$ of at least 0.5° and at most 5° generally gives satisfactory results.

The invention has been described above mainly in relation to one conductor tag. It will be clear, however, that the operation will generally take place simultaneously on all conductor tags of the lead frame.

The invention further relates to a device for carrying out the method according to the invention. The device according to the invention, comprising an anvil and a coining die for coining tips of conductors of a lead frame, is characterized in that the anvil surface has two adjoining flat portions which form an obtuse angle $\beta = 180° - \alpha$ enclosing the anvil material, the die surface of the coining die being practically parallel to one of these portions. This angle $\beta$ is preferably at least 175° and at most 179.5°.

I claim:

1. A method of manufacturing a semiconductor device of the type including a plurality of conductors formed of metal strips, a semiconductor crystal provided on one of said plurality of conductors, and a plurality of electrically conducting connections from said semiconductor crystal to remaining ones of said plurality of conductors, said method comprising the steps of
    (a) forming each of said plurality of conductors from a metal strip,
    (b) providing an anvil having a surface with two adjoining surface portions, said two adjoining surface portions being at an angle with respect to each other,
    (c) providing ends of said remaining ones of said plurality of conductors between one of said two surfaces and a matching sloped coining die surface,
    (d) plastically deforming said ends to impose said angle between said ends and said remaining ones of said plurality of conductors to form a deformed plurality of conductors,
    (e) providing each of said deformed plurality of conductors between a heating member and a clamping member to flatten and heat said deformed plurality of conductors over their entire lengths, and
    (f) applying ultrasonic energy to said ends to connect said plurality of electrically conducting connections to said ends.

2. A method according to claim 1, wherein said angle is at least 0.5° and at most 5°.

* * * * *